United States Patent
Chen et al.

(10) Patent No.: US 9,159,802 B2
(45) Date of Patent: Oct. 13, 2015

(54) MOS DEVICES WITH MASK LAYERS AND METHODS FOR FORMING THE SAME

(75) Inventors: Chu-Fu Chen, Zhubei (TW);
Chia-Chung Chen, Keelung (TW);
Chi-Feng Huang, Zhubei (TW); Victor Chiang Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 299 days.

(21) Appl. No.: 13/471,270

(22) Filed: May 14, 2012

(65) Prior Publication Data

US 2013/0299919 A1    Nov. 14, 2013

(51) Int. Cl.
*H01L 29/78* (2006.01)
*H01L 21/336* (2006.01)
*H01L 29/66* (2006.01)

(52) U.S. Cl.
CPC ...... *H01L 29/6656* (2013.01); *H01L 29/66659* (2013.01); *H01L 29/7835* (2013.01)

(58) Field of Classification Search
CPC .............................. H01L 29/78; H01L 21/336
USPC ........... 257/408, E21.409, E29.266; 438/197
See application file for complete search history.

(56) References Cited

U.S. PATENT DOCUMENTS

| | | | |
|---|---|---|---|
| 6,100,125 A * | 8/2000 | Hulfachor et al. | 438/224 |
| 6,319,784 B1 * | 11/2001 | Yu et al. | 438/301 |
| 7,521,741 B2 | 4/2009 | Jong et al. | |
| 7,888,734 B2 | 2/2011 | Chu et al. | |
| 7,977,743 B2 | 7/2011 | Chu et al. | |
| 8,350,327 B2 * | 1/2013 | Chung et al. | 257/343 |
| 2002/0056879 A1 * | 5/2002 | Wieczorek et al. | 257/368 |
| 2007/0023822 A1 * | 2/2007 | Sung et al. | 257/316 |
| 2007/0063349 A1 * | 3/2007 | Kao et al. | 257/753 |
| 2008/0093675 A1 * | 4/2008 | Yao et al. | 257/384 |
| 2010/0052057 A1 | 3/2010 | Chung et al. | |
| 2010/0279459 A1 * | 11/2010 | Huang et al. | 438/98 |
| 2011/0068411 A1 * | 3/2011 | Sun et al. | 257/384 |
| 2011/0147844 A1 | 6/2011 | Smith | |

FOREIGN PATENT DOCUMENTS

TW    201130085 A    9/2011

* cited by examiner

*Primary Examiner* — Asok K Sarkar
*Assistant Examiner* — Dmitriy Yemelyanov
(74) *Attorney, Agent, or Firm* — Slater & Matsil, L.L.P.

(57) ABSTRACT

A device includes a substrate, a gate dielectric over the substrate, and a gate electrode over the gate dielectric. A drain region and a source region are disposed on opposite sides of the gate electrode. Insulation regions are disposed in the substrate, wherein edges of the insulation regions are in contact with edges of the drain region and the source region. A dielectric mask includes a portion overlapping a first interface between the drain region and an adjoining portion of the insulation regions. A drain silicide region is disposed over the drain region, wherein an edge of the silicide region is substantially aligned to an edge of the first portion of the dielectric mask.

18 Claims, 12 Drawing Sheets

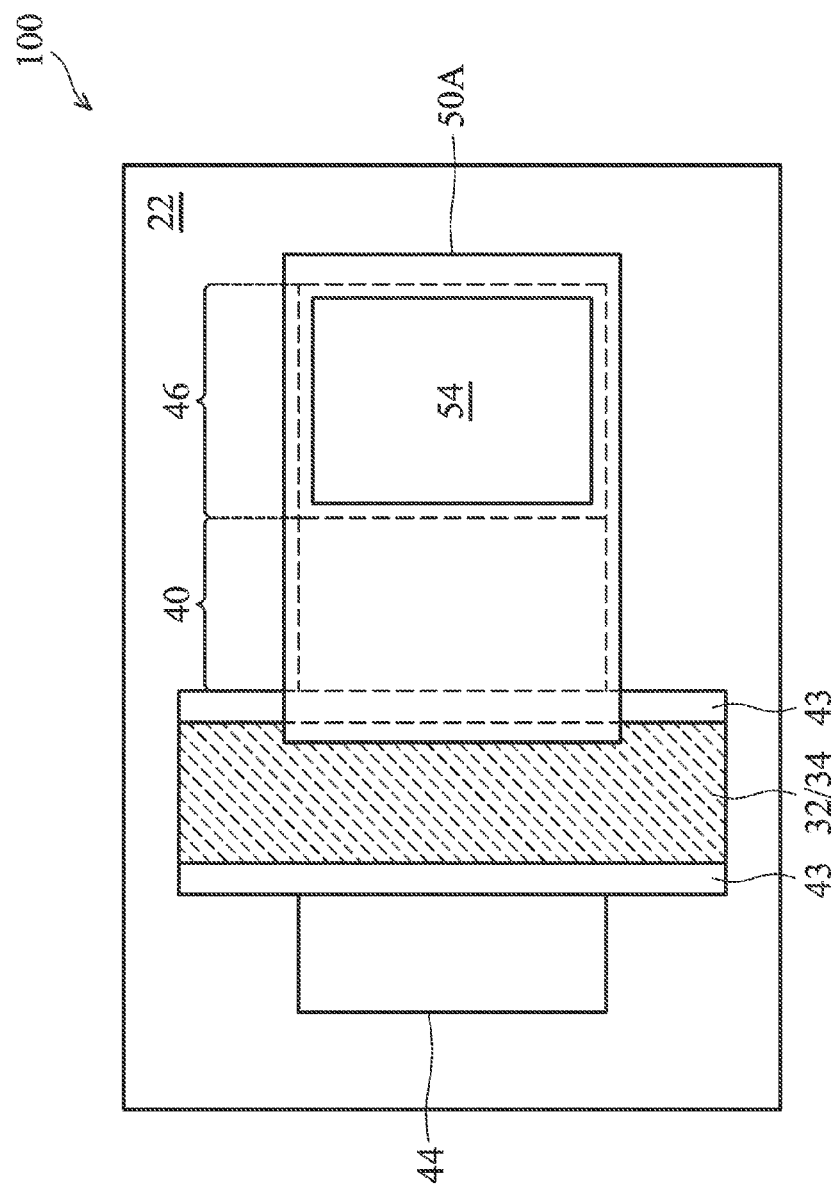

_US 9,159,802 B2_

MOS DEVICES WITH MASK LAYERS AND METHODS FOR FORMING THE SAME

BACKGROUND

The semiconductor Integrated Circuit (IC) industry has experienced rapid growth. Technological advances in IC materials and design have produced generations of ICs, with each generation having smaller and more complex circuits than the previous generations. These advances, however, have caused the increase in the complexity of processing and manufacturing ICs and, for these advances to be realized, similar developments in IC processing and manufacturing are needed.

As semiconductor circuits composed of devices such as Metal-Oxide-Semiconductor Field-Effect Transistors (MOS-FETs) are adapted for high voltage applications, problems arise with respect to incorporating a high voltage device with a low voltage device (e.g., a logic device) for a System on Chip (SoC) technology. For example, as the scaling down of logic device continues, the process flow may be accompanied with high implantation concentrations, and thus may cause high leakage problems and the degradation of the device reliability.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Metal-Oxide-Semiconductor Field-Effect Transistors (MOSFET) with reduced leakage current and the method of forming the same are provided in accordance with various exemplary embodiments. The intermediate stages of forming the MOSFET are illustrated in accordance with an exemplary embodiment. The variations of the embodiment are discussed. Throughout the various views and illustrative embodiments, like reference numbers are used to designate like elements.

Figure 1:
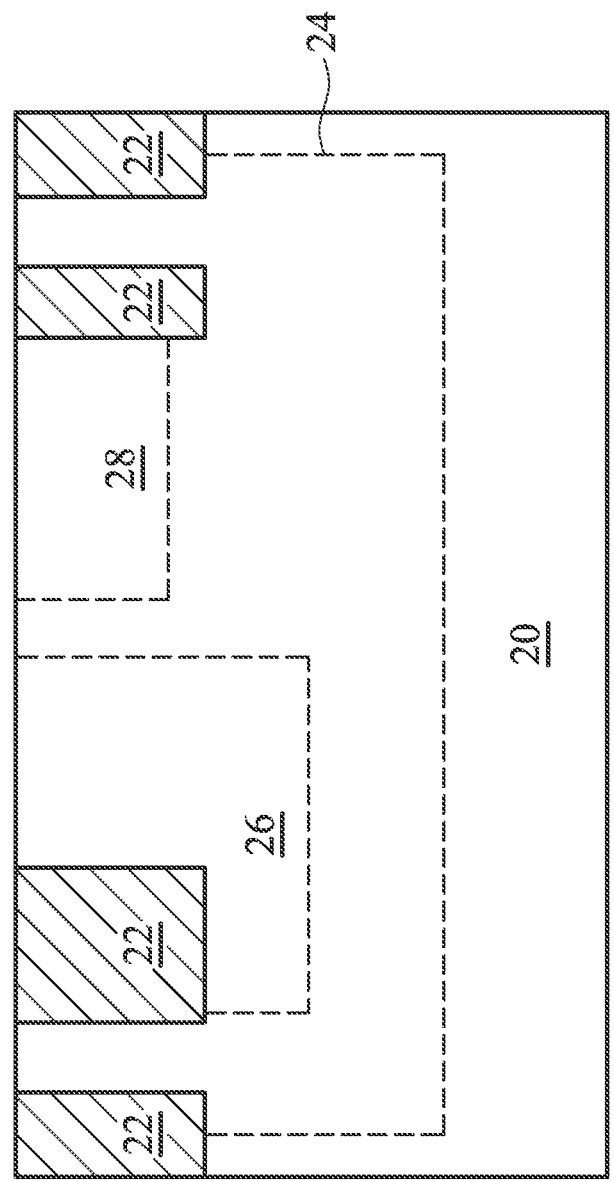
FIGS. 1 through 8 are top views and cross-sectional views of intermediate stages in the manufacturing of a Metal-Oxide-Semiconductor Field-Effect Transistors (MOSFET) in accordance with some exemplary embodiments.

FIGS. 1 through 8 are cross-sectional views and top views of intermediate stages in the manufacturing of MOSFET 100 (FIG. 8) in accordance with exemplary embodiments. Referring to FIG. 1, substrate 20 is provided, wherein substrate 20 may be a portion of a semiconductor wafer such as a silicon wafer. Alternatively, substrate 20 may include other semiconductor materials such as germanium. Substrate 20 may also include a compound semiconductor such as silicon carbon, gallium arsenic, indium arsenide, indium phosphide, III-V compound semiconductor materials, or the like. Substrate 20 may be a bulk semiconductor substrate, and an epitaxial layer may be, or may not be, formed on the bulk substrate. Furthermore, substrate 20 may be a Semiconductor-On-Insulator (SOI) substrate. In some embodiments, Deep N-Well (DNW) 24 may be formed in substrate 20, for example, through implantation.

Insulation regions 22 are formed in substrate 20 to define and electrically isolate active regions, in which devices such as transistors may be formed. Insulation regions 22 may be Shallow Trench Isolation (STI) regions or Local Oxidation of Silicon (LOCOS) regions.

FIG. 1 further illustrates the formation of n-well region 26 and p-well region 28. In some embodiments, the formation of each of n-well 26 and p-well region 28 includes forming and patterning a photo resist (not shown), wherein the regions of substrate 20 in which n-well 26 and p-well region 28 are to be formed are exposed. An implantation is then performed to form n-well 26 or p-well region 28. The respective photo resist is then removed. In some exemplary embodiments, n-well 26 and p-well region 28 may have impurity concentrations between about $10^{14}$ /cm$^3$ and about $10^{17}$ /cm$^3$. It is appreciated, however, that the values recited throughout the description are merely examples, and may be changed to different values.

Figure 2:
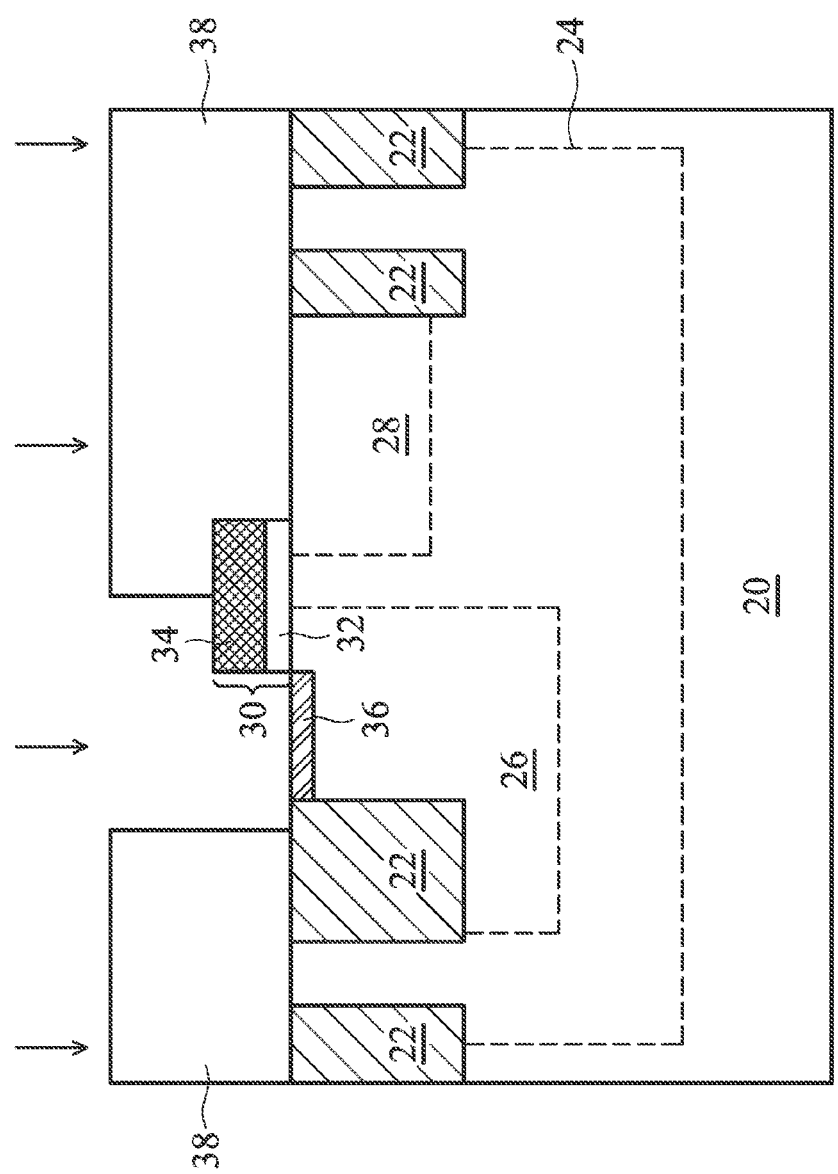

Referring to FIG. 2, gate structure 30 is formed over substrate 20. In some embodiments, gate structure 30 includes a first portion overlying n-well region 26 and a second portion overlying p-well region 28. Gate structure 30 includes gate dielectric 32, and gate electrode 34 overlying gate dielectric 32. In some exemplary embodiments, gate dielectric 32 comprises silicon dioxide. Alternatively, gate dielectric 32 may comprise a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. Gate dielectric 32 may be formed using Chemical Vapor Deposition (CVD), Atomic Layer Deposition (ALD), thermal oxide, and the like.

Gate electrode 34 may comprise polycrystalline silicon (polysilicon). Alternatively, gate electrode 34 comprises a metal or a metal silicide such as Al, Cu, W, Ni, Mo, Co, Ti, Ta, TiN, TaN, NiSi, NiPtSi, CoSi, or combinations thereof. The formation methods of gate electrode 34 include CVD, Physical Vapor Deposition (PVD), ALD, and other proper processes. The formation of gate dielectric 32 and gate electrode 34 may include forming a blanket dielectric layer and a blanket gate electrode layer, and then performing a patterning to form gate dielectric 32 and gate electrode 34.

Referring to FIG. 2, p-type source extension region 36 is formed. The formation process may include forming and patterning photo resist 38, wherein portions of n-well region 26 on the source side of gate structure 30 is exposed. An implantation is then performed to form p-type source extension region 36, which has an edge substantially self-aligned to an edge of gate structure 30. Source extension region 36 may have a p-type impurity concentration between about $10^{15}$/cm$^3$ and about $10^{14}$/cm$^3$, for example. Photo resist 38 is then removed.

Figure 3:
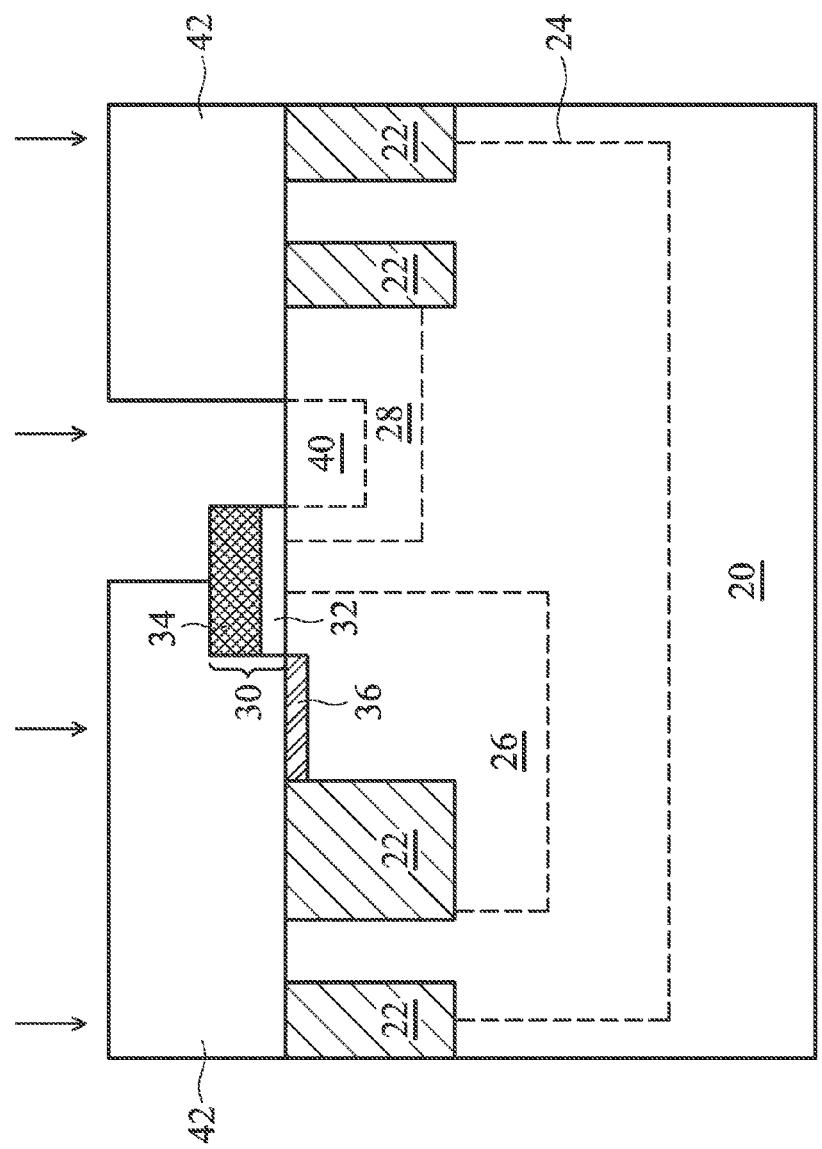

FIG. 3 illustrates the formation of n-type Lightly Doped Drain (nLDD) region 40. The formation process may include forming and patterning photo resist 42, wherein a portion of p-well region 28 on the drain side of gate structure 30 is exposed. An implantation is then performed to form nLDD region 40, which has an edge substantially self-aligned to an edge of gate structure 30. NLDD region 40 may have an n-type impurity concentration between about $10^{11}$/cm$^3$ and about $10^{13}/cm^3$, for example. After the formation of nLDD region 40, photo resist 42 is removed.

Figure 4:
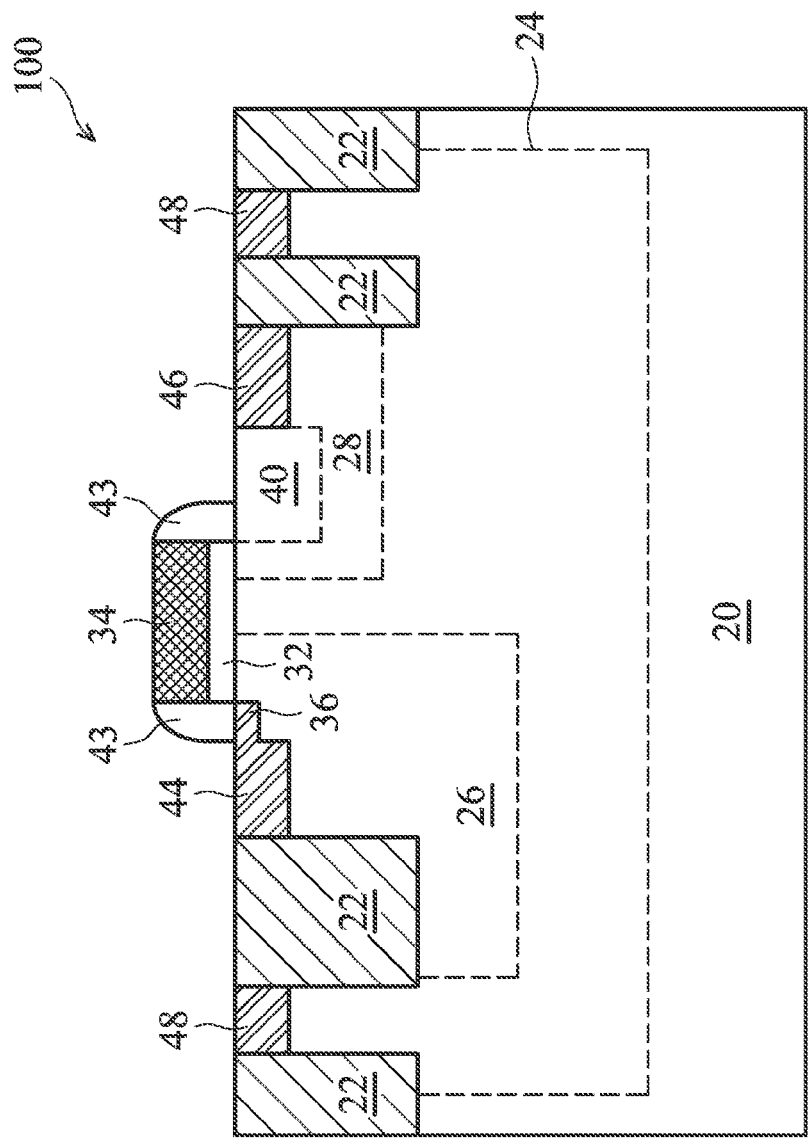

FIG. 4 illustrates the formation of gate spacers 43, source region 44, drain region 46, and n-well pickup regions 48. MOSFET 100 is thus formed. Gate spacers 43 may be formed by depositing a dielectric layer(s), and then patterning the dielectric layers to remove the horizontal portions, while the vertical portions of the dielectric layers on the sidewalls of gate structure 30 are left to from gate spacers 43. The formation process of each of source region 44 and drain region 46 may include forming a photo resist (not shown), and then performing an implantation to form source region 44 and drain region 46 in substrate 20. The impurity concentration of source region 44 and drain region 46 may be greater than about $10^{19}/cm^3$, and may be between about $10^{19}/cm^3$ and about $10^{21}/cm^3$. Drain region 46 is spaced apart from gate structure 30 by nLDD region 40. Accordingly, the respective MOSFET 100 may sustain a high drain voltage. FIG. 4 further illustrates the formation of n-well pickup regions 48 for DNW 24. N-well pickup regions 48 are also formed by implantation.

Figure 5A:
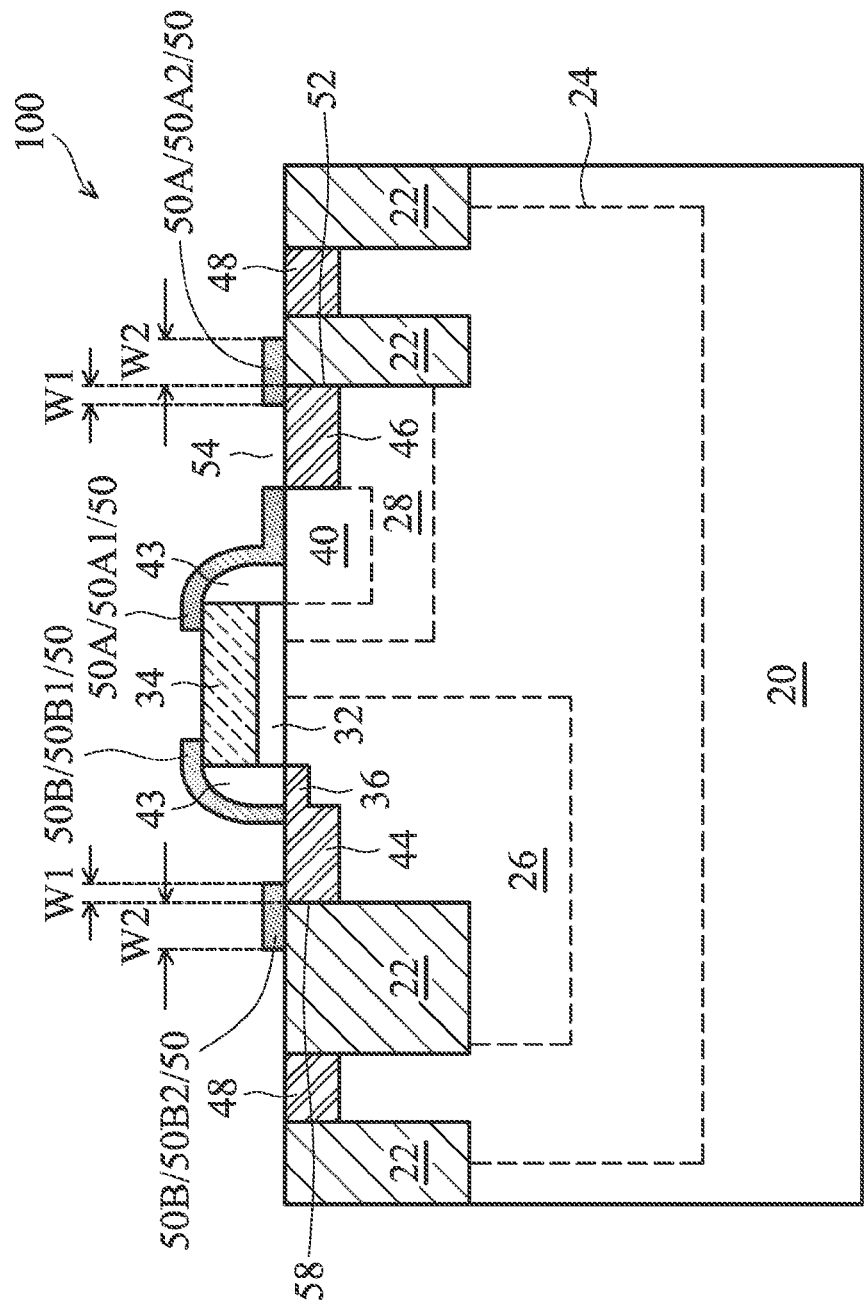
Figure 5B:
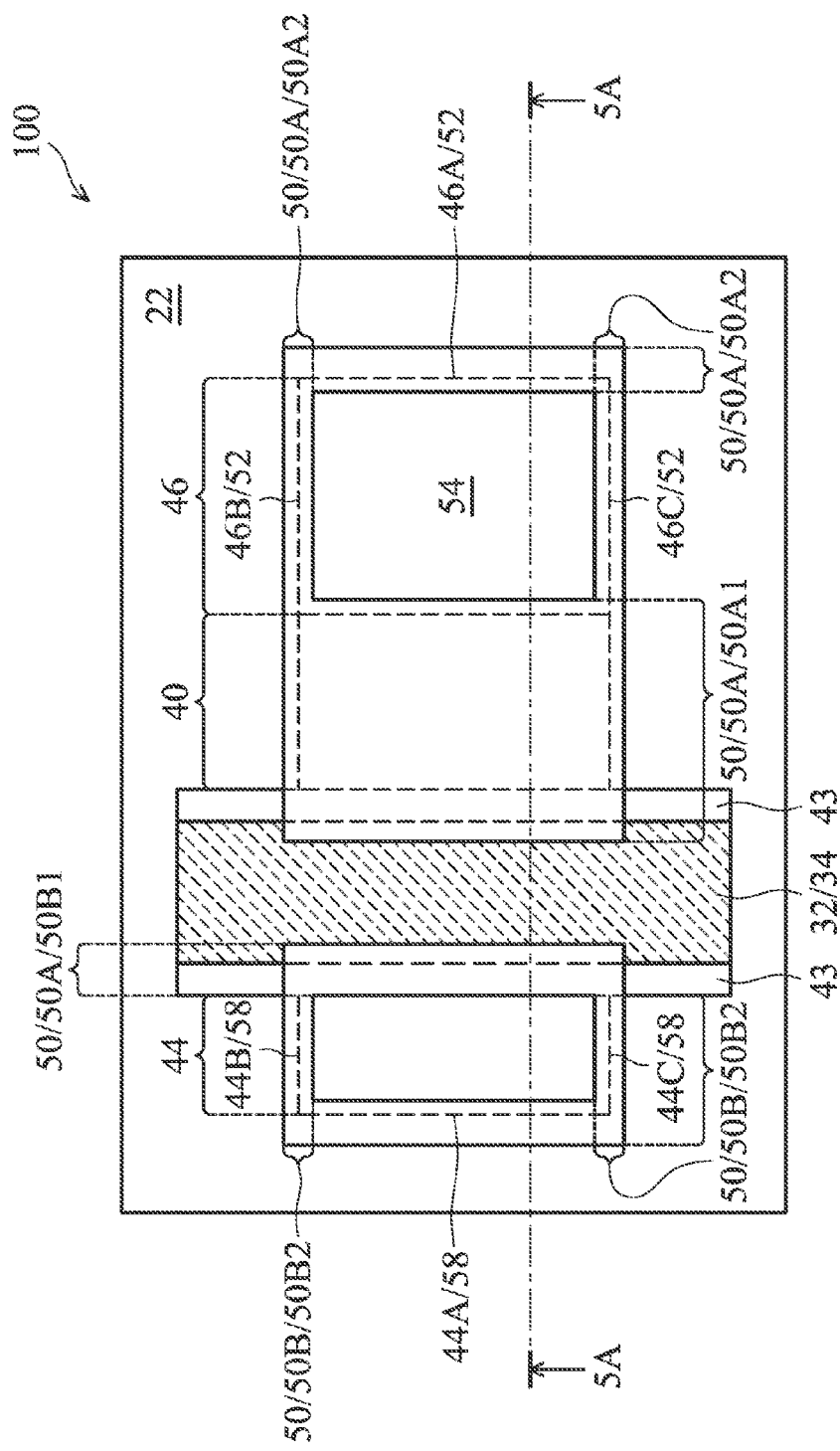

FIGS. 5A through 5C illustrate the formation of dielectric mask 50, which is alternatively referred to as a Resist Protective Oxide (RPO). Referring to FIG. 5A, dielectric mask 50 is formed and patterned. Dielectric mask 50 may include silicon oxide or other types of dielectric materials including, and not limited to, silicon carbide, silicon nitride, high-k dielectric materials, combinations thereof, and multi-layers thereof. Dielectric mask 50 may or may not include portion 50A that is on the drain side of gate structure 30. Dielectric mask portion 50A may or may not include portion 50A1 over and aligned to nLDD region 40 in order to prevent silicide to be formed on nLDD region 40. Dielectric mask portion 50A1 may also extend on the sidewall of gate spacer 43, and possibly over gate structure 30. Dielectric mask 50 may also include portion 50A2 over and aligned to interface 52, which is the interface between the edges of drain region 46 and the edges of the adjoining STI region 22. At least a center portion of drain region 46 is exposed through opening 54 in dielectric mask 50.

Dielectric mask portion 50A2 overlaps a portion of drain region 46, with overlapping width W1 being greater than about 200 nm, for example. Dielectric mask portion 50A2 further overlaps STI region 22, with overlapping width W2 being greater than about 100 nm, for example. Width W1 and W2 may also be smaller than about 100 nm. Dielectric mask portion 50A2 also covers any divot that may occur at interface 52, which divot is the recess in drain region 46 and/or STI region 22 at interface 52.

In some embodiments, on the source side, dielectric mask 50 includes dielectric mask portion 50B (including 50B1 and 50B2) that covers the interfaces 58 between the edges of source region 44 and the edges of the adjoining portion of STI region 22. Similarly, dielectric mask portion 50B2 overlaps a portion of source region 44 and an adjoining portion of STI region 22, with overlapping widths being W1 and W2, respectively. Dielectric mask portion 50B also covers any divot that may occur at interface 58, which divot is the recess in source region 44 and/or STI region 22 at interface 58. Dielectric mask portion 50B may or may not include a portion 50I extending on the top surface of gate structure 30 and on the sidewall of gate spacer 43. In alternative embodiments, dielectric mask 50 does not include any portion that overlaps interface 58.

FIG. 5B illustrates an exemplary top view of the structure shown in FIG. 5A, wherein the cross-sectional view in FIG. 5A is obtained from the plane crossing line 5A-5A in FIG. 5B.

As shown in FIG. 5B, substantially an entirety of nLDD region 40 is covered by dielectric mask portion 50A1. Dielectric mask portions 50A1 and 50A2 may be joined with each other to form a continuous region. Dielectric mask portions 50A2 may cover some or all interfaces 52 formed between drain region 46 and STI region 22. For example, in some embodiments, drain region 46 includes edge 46A that is substantially parallel to the lengthwise direction of gate structure 30, and edges 46B and 46C that are perpendicular to edge 46A. Edges 46B and 46C also connect to the edges of nLDD region 40. Accordingly, dielectric mask portion 50A2 also includes three strips, each covering one of edges 46A, 46B, and 46C, which also form interfaces 52 with the adjoining STI regions 22. Dielectric mask portion 50A may form a ring, with a center portion of drain region 46 exposed through opening 54 in the ring. The side of the ring close to gate structure 30 may be wider than the side of the ring away from gate structure 30.

Similarly, dielectric mask portion 50B, if formed, may also include a portion parallel to the lengthwise direction of gate structure 30 and covering edge 44A of source region 44. Dielectric mask portion 50B may also include portions perpendicular to the lengthwise direction of gate structure 30 and covering edges 44B and 44C of source region 44. FIG. 5C illustrates a top view of an embodiment similar to the embodiment in FIGS. 5A and 5B, except that dielectric mask portion 50B is not formed. Dielectric mask portion 50A, however, is still formed on the drain side of MOSFET 100.

Figure 6A:
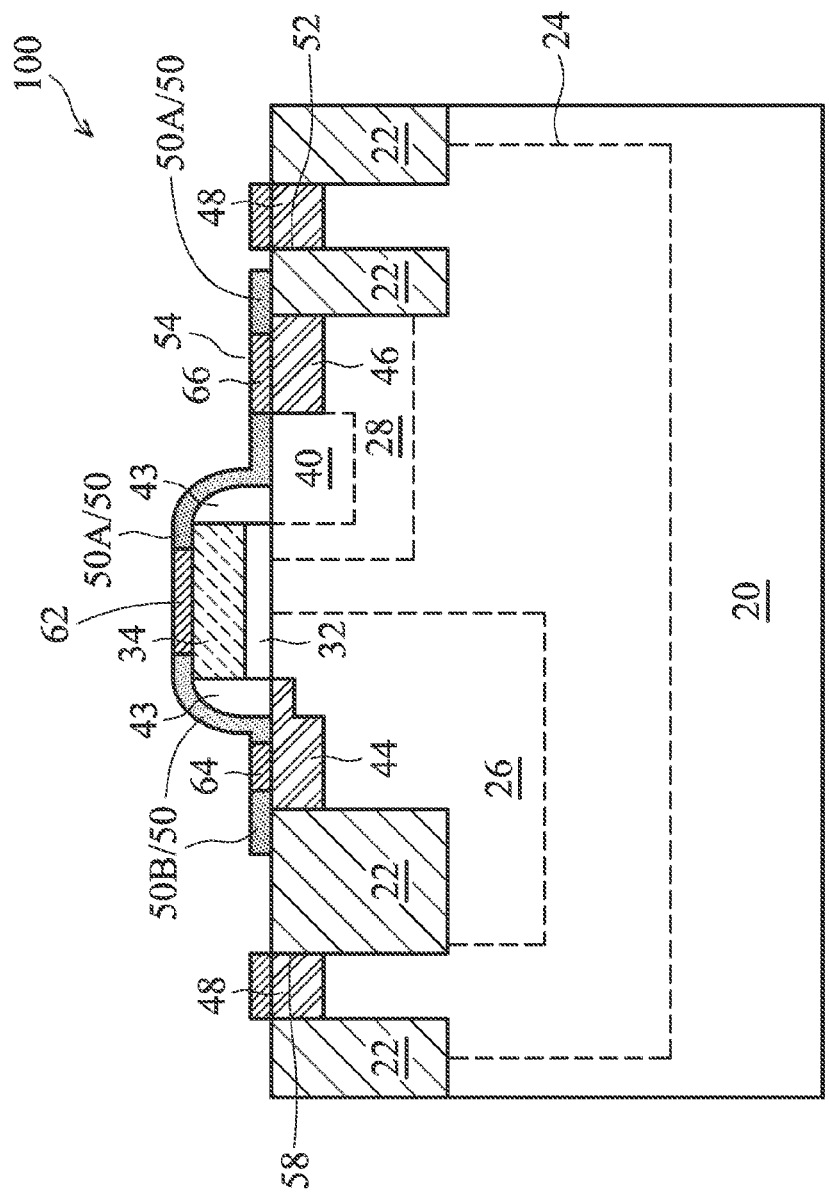

FIG. 6A illustrates the formation of gate silicide region 62, source silicide region 64, and drain silicide region 66. In some embodiments, the formation of silicide regions 62/64/66 may include a self-aligned silicide (salicide) process. The silicide process include blanket depositing a metal layer (not shown) on the structure shown in FIGS. 5A/5B or FIG. 5C, followed by an anneal to cause the reaction between the metal layer and the underlying silicon. Silicide regions 62, 64, and 66 are thus formed. The metal layer may include nickel, cobalt, titanium, platinum, or the like. The Unreacted portion of the metal layer is then removed. Due to the masking of dielectric mask 50, the resulting drain silicide region 66 is formed in opening 54 in dielectric mask portion 50A. Silicide region 66 does not extend to interface 52 between drain region 46 and STI region 22. Similarly, source silicide region 64 is formed in the opening in dielectric mask portion 50B, and does not extend to interface 58, which is between source region 44 and STI region 22.

Figure 6B:
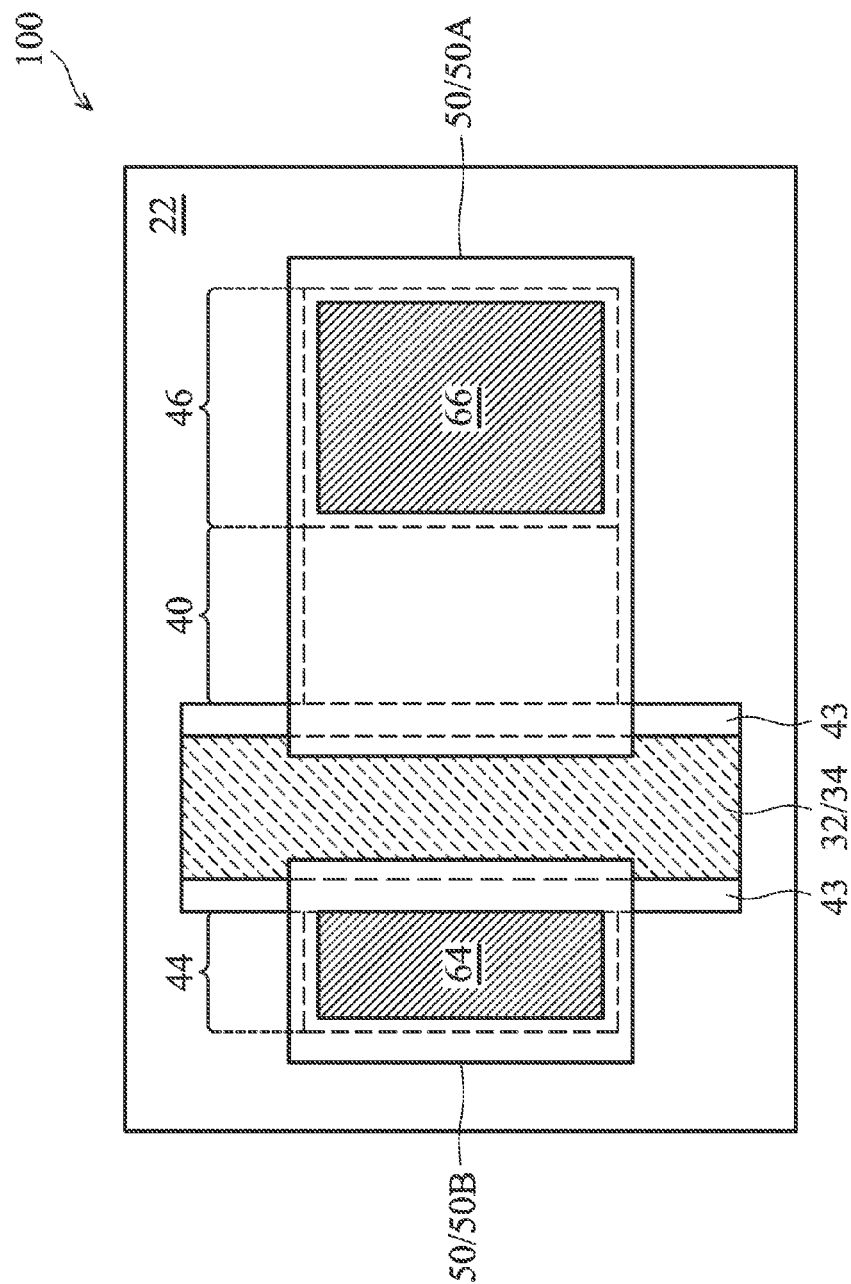

FIG. 6B illustrates a top view of the structure shown in FIG. 6A. It is observed that the formation of silicide regions 62/64/66 is self-aligned to the openings in dielectric mask 50. The edges of the source silicide region 64 and drain silicide region 66 are aligned to the inner edges of the dielectric mask rings that are formed of dielectric mask portions 50B and 50A, respectively.

Figure 7:
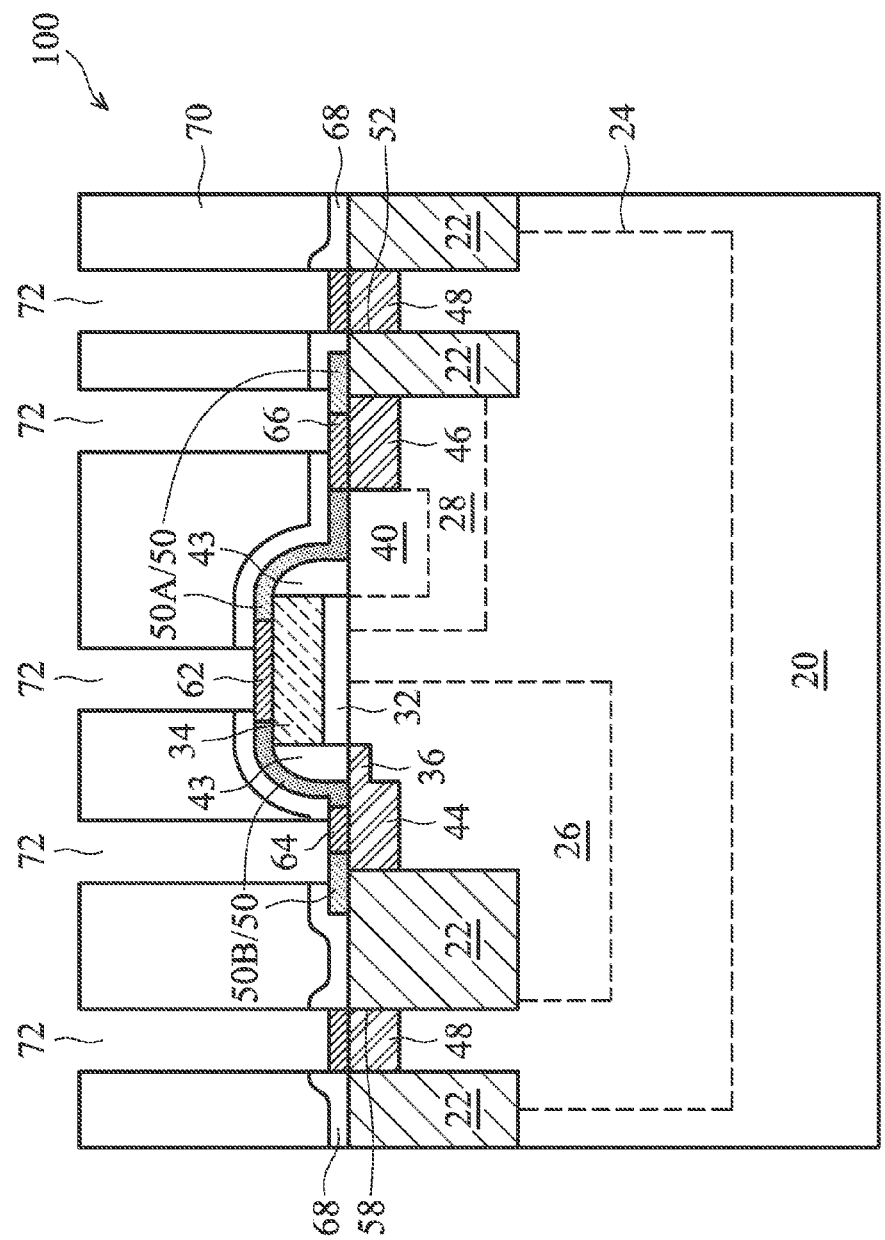

FIG. 7 illustrates the formation of an insulating dielectric layer 68, such as a Contact Etch Stop Layer (CESL). Insulating dielectric layer covers, and are in contact with, silicide regions 62, 64, and 66 and dielectric mask 50. Insulating dielectric layer 68 may be formed of dielectric materials such as silicon oxide, silicon nitride, or combinations thereof. Furthermore, the material of insulating dielectric layer 68 is selected to be different from that of dielectric mask 50, so that in the etching of insulating dielectric layer 68 and the overlying Inter-Layer Dielectric (ILD) 70 for forming contact openings 72, there is a high etching selectivity between insulating dielectric layer 68 and dielectric mask 50.

Following the formation of insulating dielectric layer 68, ILD 70 is formed. Contact openings 72 are then formed in ILD 70 and insulating dielectric layer 68, so that silicide regions 62, 64, and 66 are exposed through contact openings 72. In the formation of contact openings 72, ILD 70 is first etched, with insulating dielectric layer 68 acting as the etch stop layer. After the etch stops on insulating dielectric layer 68, the exposed portions of insulating dielectric layer 68 in openings 72 are etched. The etch of insulating dielectric layer 68 stops on silicide regions 62/64/66. In the situation (as illustrated) that contact openings 72 are misaligned with the respective silicide regions 64 and 66, dielectric mask 50 is exposed in contact openings 72. Accordingly, in the etch of insulating dielectric layer 68, dielectric mask 50 acts as the etch stop layer, and may be substantially un-etched, or at least have a lower portion left after the etch of insulating dielectric layer 68 is finished. Accordingly, interfaces 52 between drain region 46 and STI region 22 are protected by dielectric mask portion 50A. In the embodiments wherein dielectric mask 50B is formed on the source side, interfaces 58 between source region 44 and STI region 22 are protected by dielectric mask portion 50B.

Figure 8:
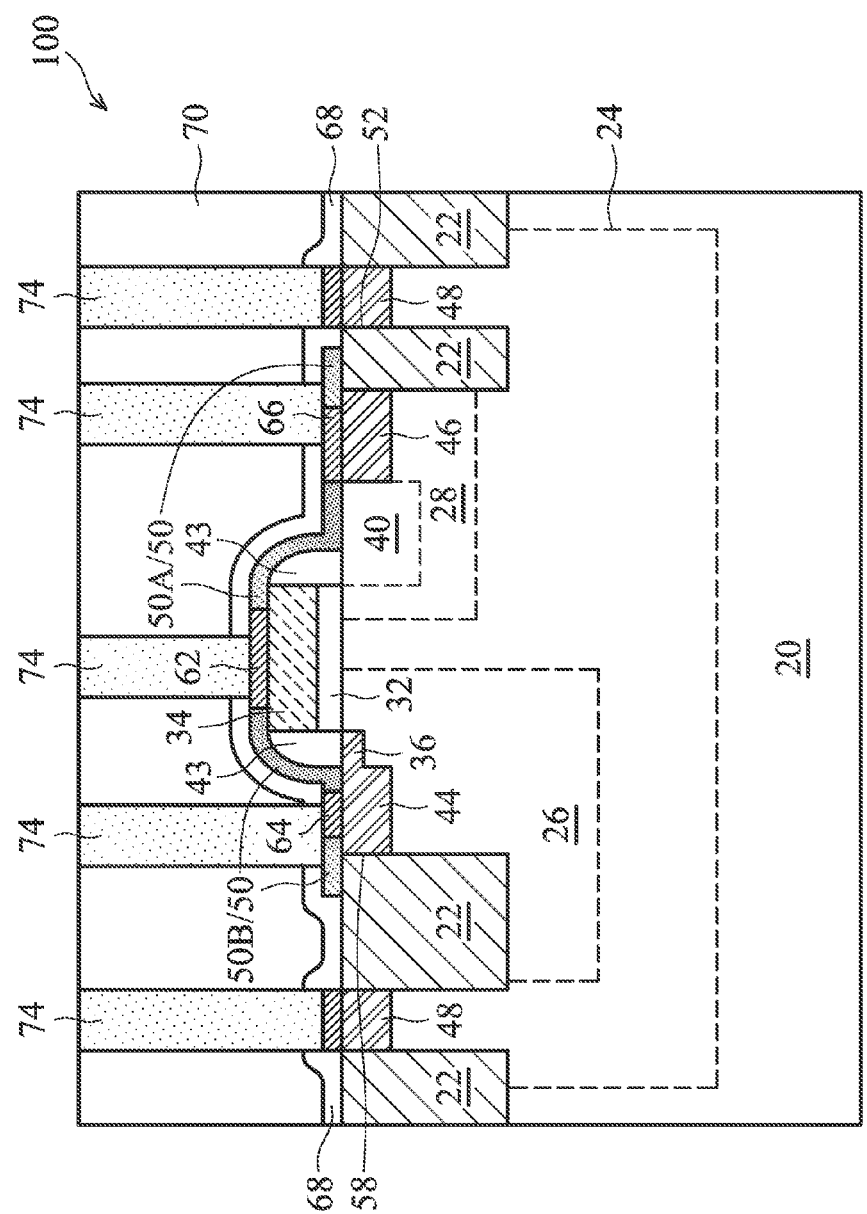

FIG. 8 illustrates the formation of contact plugs 74 in contact openings 72. In some embodiments, contact plugs 74 comprise tungsten. The formation process may include filling a conductive material, such as tungsten, into openings 72, and then preforming a Chemical Mechanical Polish (CMP) to remove excess portions of the conductive material from over ILD 70. The remaining portions of the conductive material form contact plugs 74.

It is appreciated that although the illustrated embodiments show a high voltage MOSFET, dielectric mask 50 may also be formed to cover the interfaces of the source/drain regions and the STI regions in other types of devices including, and not limited to, low voltage MOSFETs such as logic MOSFETs, memory MOSFETs, and the like. In the illustrated embodiments, p-type MOSFETs are provided to explain the concept of the embodiments. It is also appreciated that the teaching in the embodiments is readily applicable on the formation of n-type MOSFETs, with the conductivity types of the respective doped regions inverted from that of p-type MOSFETs.

Figure 9:
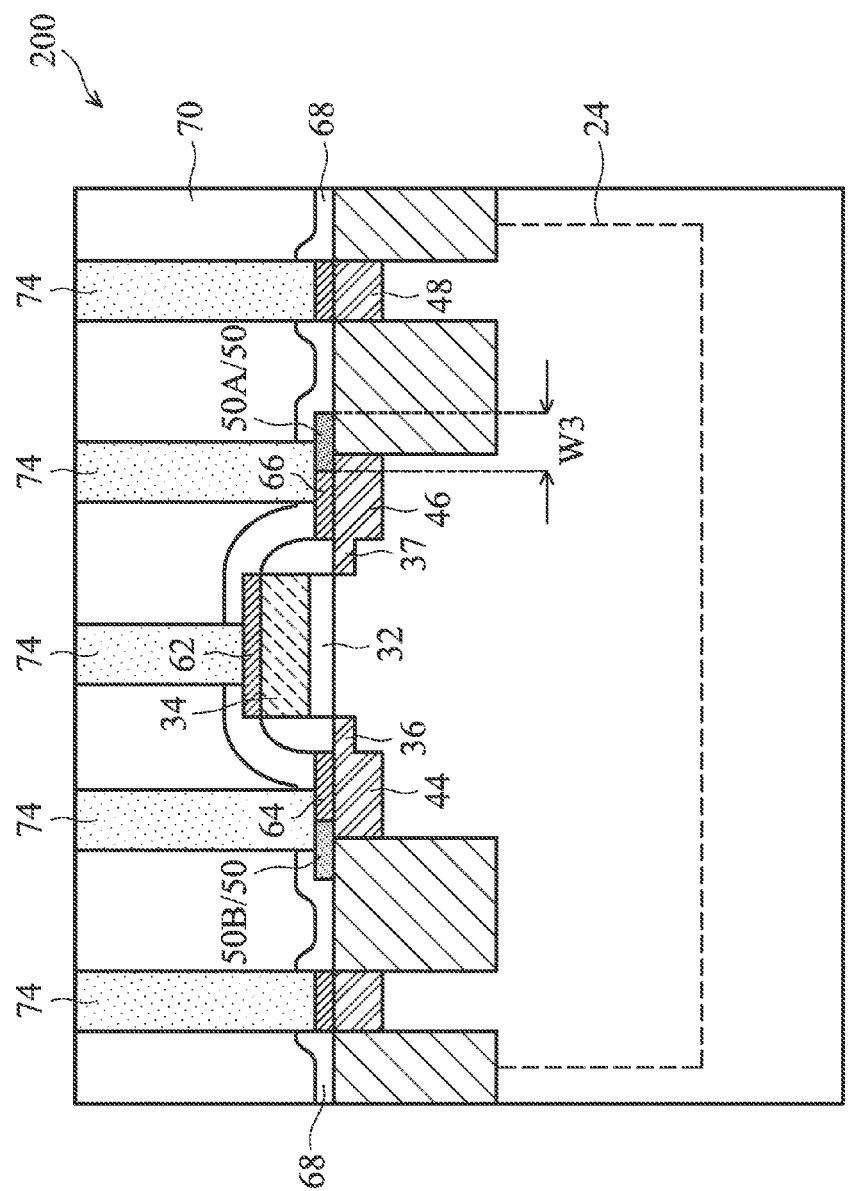
FIG. 9 illustrates a cross-sectional view of a MOSFET in accordance with alternative embodiments.

Furthermore, the MOSFET in accordance with embodiments may have different structures than illustrated in FIGS. 1 through 8. For example, FIG. 9 illustrates MOSFET 200, which includes source extension region 36 and drain extension region 37, whose edges are substantially aligned to the edges of gate electrode 34. N-well 26 and p-well region 28 are not formed in these embodiments. MOSFET 200 may have a drain operation voltage at around 5 volts, for example. Dielectric mask portion 50B, which is on the source side, may be formed or may be omitted. Width W3 of dielectric mask portions 50A and/or 50B in accordance with embodiments may be between about 0.1 µm and about 0.8 µm in accordance with some embodiments.

The formation of dielectric mask 50 may prevent the leakage to the source/drain junctions. For example, if a divot is formed at the interface 52 between drain region 46 and the adjoining STI region 22, dielectric mask 50 at least partially fills the divot, and further prevents contact plug 74 from extending into the divot. The leakage caused by the undesirable formation of the divot is thus eliminated.

In accordance with embodiments, a device includes a substrate, a gate dielectric over the substrate, and a gate electrode over the gate dielectric. A drain region and a source region are disposed on opposite sides of the gate electrode. Insulation regions are disposed in the substrate, wherein edges of the insulation regions are in contact with edges of the drain region and the source region. A dielectric mask includes a portion overlapping a first interface between the drain region and an adjoining portion of the insulation regions. A drain silicide region is disposed over the drain region, wherein an edge of the silicide region is substantially aligned to an edge of the portion of the dielectric mask.

In accordance with other embodiments, a device includes a substrate, a gate dielectric over the substrate, a gate electrode over the gate dielectric, and a gate spacer on a sidewall of the gate electrode. A drain region and a source region are disposed on opposite sides of the gate electrode. Insulation regions are disposed in the substrate, wherein edges of the insulation regions are in contact with edges of the drain region to form a first interface parallel to a lengthwise direction of the gate electrode, and a second and a third interfaces perpendicular to, and adjoining, the first interface. A dielectric mask has a first, a second, and a third portion overlapping the first, the second, and the third interfaces, respectively, and may has a fourth portion on a sidewall of the gate spacer. A drain silicide region is over the drain region, wherein the drain silicide is encircled by the dielectric mask.

In accordance with yet other embodiments, a method includes forming insulation regions in a semiconductor substrate, forming a gate structure comprising a gate dielectric and a gate electrode over the semiconductor substrate, and forming a source region and a drain region on opposite sides of the gate structure. A dielectric mask is formed, wherein the dielectric mask includes a portion overlapping an interface between the drain region and the semiconductor substrate. A portion of the drain region is exposed through an opening in the dielectric mask. A drain silicide region is formed over the exposed portion of the drain region. An insulating dielectric layer is formed over the drain silicide region and the dielectric mask.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
 a substrate;
 a gate dielectric over the substrate;
 a gate electrode over the gate dielectric;
 a drain region and a source region on opposite sides of the gate electrode;
 insulation regions in the substrate, wherein edges of the insulation regions are in contact with edges of the drain region and the source region;
 a dielectric mask comprising a first portion overlapping a first interface between the drain region and an adjoining portion of the insulation regions;

a drain silicide region over the drain region, wherein an edge of the drain silicide region is defined by an edge of the first portion of the dielectric mask;
an etch stop layer over and physically contacting respective top surfaces of the drain silicide region and the dielectric mask, the etch stop layer having a different material composition than the dielectric mask;
an inter-layer dielectric layer over the etch stop layer; and
a contact plug over the drain silicide region, wherein the contact plug penetrates through the etch stop layer and the inter-layer dielectric layer.

2. The device of claim 1, wherein the edge of the drain silicide region contacts the edge of the first portion of the dielectric mask to form a substantially vertical interface.

3. The device of claim 1, wherein the first interface is parallel to a lengthwise direction of the gate electrode, and wherein the first portion of the dielectric mask forms a strip having a lengthwise direction parallel to the lengthwise direction of the gate electrode.

4. The device of claim 3, wherein the drain region further comprises edges forming a second interface and a third interface with the insulation regions, wherein the second and the third interfaces are perpendicular to, and are connected to, the first interface, and wherein the dielectric mask further comprises portions overlapping the second and the third interfaces.

5. The device of claim 1 further comprising:
a gate spacer on a sidewall of the gate electrode; and
a lightly doped drain region between the drain region and the gate electrode, wherein the dielectric mask further comprises a second portion overlapping the lightly doped drain region, and wherein the second portion of the dielectric mask extends on a sidewall of the gate spacer and extending over the gate electrode.

6. The device of claim 1, wherein the dielectric mask further comprises a second portion overlapping interfaces between the source region and the insulation regions, and wherein a center portion of the source region is not covered by the dielectric mask.

7. A device comprising:
a substrate;
a gate dielectric over the substrate;
a gate electrode over the gate dielectric;
a gate spacer on a sidewall of the gate electrode;
a drain region and a source region on opposite sides of the gate electrode;
insulation regions in the substrate, wherein edges of the insulation regions are in contact with edges of the drain region to form a first interface parallel to a lengthwise direction of the gate electrode, and a second and a third interfaces perpendicular to, and adjoining, the first interface;
a dielectric mask comprising a first, a second, and a third portions overlapping the first, the second, and the third interfaces, respectively;
a drain silicide region over the drain region, wherein the drain silicide region is encircled by the dielectric mask, with an edge of the drain silicide region in contact with an edge of the dielectric mask; and
a dielectric layer over and physically contacting respective top surfaces of the drain silicide region and the dielectric mask, the dielectric layer having a different material composition than the dielectric mask.

8. The device of claim 7 further comprising a lightly doped drain region between the drain region and the gate electrode, wherein the dielectric mask overlaps the lightly doped drain region.

9. The device of claim 7, wherein the dielectric mask further comprises a fourth portion on a sidewall of the gate spacer, wherein the first, the second, the third, and the fourth portions of the dielectric mask form a ring having inner edges and outer edges, and wherein edges of the drain silicide region are substantially aligned to the inner edges of the ring.

10. The device of claim 7 further comprising:
a contact plug over the drain silicide region, wherein the contact plug penetrates through the dielectric layer, and has a bottom surface contacting the top surface of the dielectric mask.

11. The device of claim 7, wherein the dielectric mask does not overlap interfaces between the source region and the insulation regions.

12. A device comprising:
a semiconductor substrate;
a gate dielectric over the semiconductor substrate;
a gate electrode over the gate dielectric;
a source/drain region in the semiconductor substrate;
a Shallow Trench Isolation (STI) region in the semiconductor substrate, with an edge of the STI region in contact with an edge of the source/drain region to form an interface;
a dielectric mask over the source/drain region, wherein a bottom surface of the dielectric mask is in contact with a top surface of an outer portion of the source/drain region, and wherein the dielectric mask comprises an opening aligned to at least a portion of the source/drain region;
a source/drain silicide region over and contacting the source/drain region, wherein edges of the source/drain silicide region are in physical contact with respective edges of the dielectric mask to form vertical interfaces;
a contact etch stop layer over and physically contacting respective top surfaces of the dielectric mask and the source/drain silicide region;
an Inter-Layer Dielectric (ILD) over the contact etch stop layer; and
a contact plug penetrating through the ILD and the contact etch stop layer, wherein the contact plug comprises bottom surfaces in contact with both a top surface of a portion of the source/drain silicide region and a top surface of the dielectric mask.

13. The device of claim 12, wherein the dielectric mask overlaps the interface.

14. The device of claim 12, wherein the contact plug overlaps a portion of the STI region.

15. The device of claim 12, wherein the dielectric mask comprises a portion between the gate electrode and the contact plug.

16. The device of claim 15, wherein the portion of the dielectric mask overlaps the gate electrode.

17. The device of claim 12, wherein an inner edge of the contact plug and an inner edge of the source/drain silicide region are misaligned.

18. The device of claim 12, wherein the dielectric mask and the contact etch stop layer are formed of different materials.

* * * * *